(12) United States Patent
Hidler

(10) Patent No.: US 6,407,502 B2
(45) Date of Patent: *Jun. 18, 2002

(54) EL DISPLAY WITH ELECTRODES NORMAL TO THE SURFACE

(75) Inventor: Henry T. Hidler, Danvers, MA (US)

(73) Assignee: Lite Array, Inc., Novato, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,366

(22) Filed: Sep. 16, 1998

Related U.S. Application Data

(60) Provisional application No. 60/059,084, filed on Sep. 16, 1997.

(51) Int. Cl.$^7$ .............................. H01J 1/62; H01J 63/04
(52) U.S. Cl. ...................... 313/505; 313/506; 313/495; 313/509; 313/498
(58) Field of Search ................................ 313/498–506; 445/23, 46, 49; 315/169.3

(56) References Cited

U.S. PATENT DOCUMENTS

| | | | | |
|---|---|---|---|---|
| 2,922,076 A | * | 1/1960 | Sack et al. ..................... | 315/71 |
| 3,512,041 A | * | 5/1970 | Dalmasso ................... | 315/169 |
| 4,266,223 A | * | 5/1981 | Frame ......................... | 340/719 |
| 5,239,227 A | * | 8/1993 | Kikinis ........................ | 313/506 |
| 5,525,867 A | * | 6/1996 | Williams ................. | 315/169.3 |

* cited by examiner

Primary Examiner—Nimeshkumar D. Patel
Assistant Examiner—Mariceli Santiago
(74) Attorney, Agent, or Firm—Hale and Dorr LLP

(57) ABSTRACT

A modified electroluminescent display device structure using sub-pixel electrodes allows higher efficiency, larger size capability, and higher manufacturing yields than existing construction. Row and/or column configurations use sub-pixel electrodes connecting through vias in insulating layers to connect to opaque row and column high conductivity line patterned electrodes. Electrode losses due to line configured electrode resistances are substantially reduced.

7 Claims, 5 Drawing Sheets

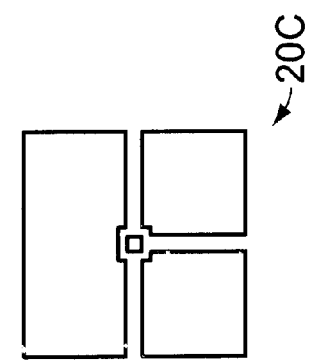
FIG. 5C
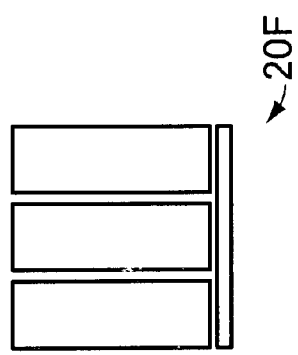
FIG. 5F
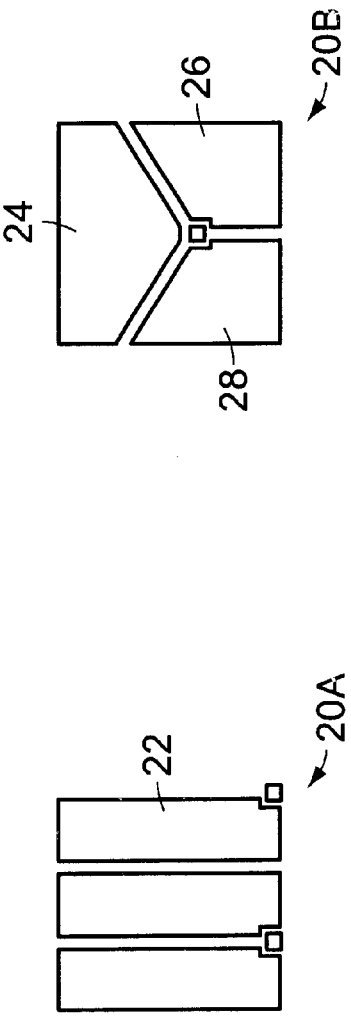
FIG. 5B
FIG. 5E
FIG. 5A
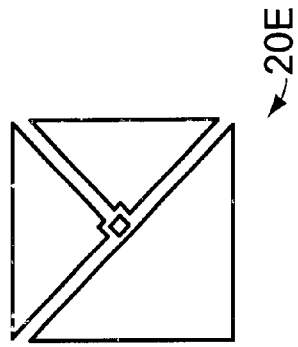
FIG. 5D

EL DISPLAY WITH ELECTRODES NORMAL TO THE SURFACE

This application claims benefit of provisional application No. 60/059,084 filed Sep. 16, 1997.

BACKGROUND OF THE INVENTION

The present invention relates in general to electroluminescent display devices, and more particularly, an improved sub-pixel structure device resulting in higher efficiencies, higher yields, larger display size capabilities, and simpler manufacturing methods.

Existing electroluminescent display structures, are limited in size due to the high resistivity of the patterned transparent column conductors which creates excessive voltage drops and power losses as greater line lengths and/or higher resolutions are sought. These high resistances further limit device size by adding to the (RC) time constant of the display elements, thereby complicating various existing voltage drive methods. A method currently under development to alleviate these problems adds an active matrix behind each display element which essentially removes size limits and allows separation of the addressing voltage and frequency from the phosphor exciting voltage and frequency, hence offering higher brightness and efficiency. In order to accomplish an active matrix in electroluminescent display devices, the active transistor elements behind each pixel must be high voltage devices and the number of required high voltage devices is the product of the number of columns and rows. This compares unfavorably to the number of high voltage devices in existing passive drive methods where the total equals the sum of number of columns and rows.

It is, therefore, an object of the present invention to obviate the disadvantages of prior art by reducing electrode power losses. A further object of the present invention is to reduce the electrical time constant of existing electroluminescent devices. Still other objects of the present invention are balanced material interfaces thereby minimizing retained image phenomenon, larger size display design configurations, and a reverse construction to allow electrode structure to be completely fabricated and tested for conformity to specifications prior to adding the light emitting layer.

SUMMARY OF THE INVENTION

In general, in one aspect, the invention features an electroluminescent display device having a light emitting layer, the light emitting layer featuring a first and a second surface on opposites sides of the layer, an electrode assembly in contact with and on the first surface of the light emitting layer and a transparent conductive layer in contact with the second surface and on a side of the light emitting layer opposite from the electrode assembly.

Implementations of the invention include one or more of the following. The electrode assembly features a combination of a plurality of line patterned row and column electrodes with a plurality of sub-pixel row electrodes. The row and column line patterned electrodes are separated by a first insulating layer. The sub-pixel row electrodes are adjacent to the column sub-pixel electrodes and in immediate contact with the light emitting layer and are connected to at least one of the line patterned row electrodes through conductive vias featured in the insulation layer between the row and column line patterned electrodes.

The electrode assembly may also feature a plurality of column sub-pixel electrodes adjacent to the row sub-pixel electrodes. The row and column sub-pixel electrodes are separated from the line patterned electrodes with a second insulating layer, are in immediate contact with the light emitting layer and are connected to at least one of the line patterned row and column electrodes, respectively, through conductive vias featured in the insulation layers between the different electrodes.

In a specific aspect of the invention, the electroluminescent display device features a plurality of row and column line patterned electrodes, separated by an insulating layer, a plurality of row sub-pixel electrodes adjacent to the column line patterned electrodes and connected through conductive vias to the row line patterned electrodes, a light emitting layer in contact with the sub-pixel and column electrodes, a transparent pixel defined conductive layer in contact with the side of the light emitting layer opposite from the electrodes, and a transparent substrate in conduct with the conductive pixels. The contact between the sub-pixel electrodes and the row line patterned electrodes is facilitated by a plurality of electrically conductive vias, each via extending through the insulating layer.

The electrode assembly may also feature a substrate, a plurality of opaque line patterned row and column electrodes separated by an insulating layer, and a plurality of row sub-pixel electrodes adjacent to the column electrodes. The insulating layer has conductive vias connecting the line patterned row electrodes with the row sub-pixel electrodes.

The electrode assembly may also feature column sub-pixel electrodes adjacent to the row sub-pixel electrodes and in contact with the light emitting layer. A second insulating layer separates the row and column sub-pixel electrodes from the column line patterned electrodes. The row and column sub-pixel electrodes are connected to the row and column line patterned electrodes by conductive row and column vias featured in the first and second insulation layer, respectively. In this case the transparent conductive film layer may be a continuous unpatterned film.

The electrodes may be opaque, high conductivity metals or alloys such as aluminum or chromium or superconductors. The active area of the electroluminescent device may be hermetically sealed with a cover glass allowing exposure of the electrode contacts. The line patterned electrodes may extend to parallel edges of the substrate for electrical contact with the exciting voltages. The column line patterned electrodes may be directed perpendicular to the row line patterned electrodes. The different layers may be formed by chemical vapor deposition, thermal evaporation, electron beam deposition and sputtering. The vias in the insulating layers may be formed by photolithography, laser ablation or masking methods. The light emitting layer may be a thin film and it may consist of organic electroluminescent materials. The substrate may be an opaque or transparent material selected from the group of silicon, ceramics, insulated metals and glass.

In general, in another aspect, the invention features a method of manufacturing an electroluminescent display including the steps of manufacturing an electrode assembly, testing the electrode assembly, depositing a light emitting layer on the electrode assembly, depositing a transparent conductive layer on the light emitting layer and covering and sealing the active area with a glass cover. The manufacturing of the electrode assembly may feature the steps of depositing a plurality of first line patterned conductive metal electrodes on a substrate, depositing a first insulating layer on the fist line patterned electrodes, forming vias in the insulating layer in contact with the electrodes and depositing a plurality of second line patterned electrodes and a plurality of row sub-pixel electrodes on the first insulating layer, wherein the row sub-pixel electrodes contact the first line patterned electrodes through the formed vias.

In another aspect, the invention features a method of making an electroluminescent display by depositing transparent conductive pixels on a transparent substrate followed by the deposition of a light emitting layer. On top of the light emitting layer high conductivity metal line patterned column electrodes are simultaneously deposited with row sub-pixel electrodes. An insulating layer is then deposited over the line patterned column and row sub-pixel layer with conductive vias penetrating through the insulating layer thickness. An electrically conducting material is then deposited defining the line patterned row electrode. The line patterned row electrodes extend to the edges of the substrate for electrical contact and contact the row sub-pixel electrodes through the said vias. A cover glass is then added over the active structure hermetically sealing the device, but allowing exposure of row and column electrodes ends for electrical connection. This method may include depositing column sub-pixel electrodes adjacent to the row sub-pixels and a second insulating layer separating the sub-pixel electrodes form the column line patterned electrodes. The second insulation layer has conductive vias connecting the sub-pixel electrodes to the line patterned electrodes.

In yet another aspect, the invention features a method of making an electroluminescent device by depositing line patterned column electrodes on a substrate of glass, ceramic or insulated metal extending to parallel edges of the substrate for electrical connection. An insulating layer, featuring column vias and row vias, is then added over the column electrodes. Line patterned row electrodes are then deposited at right angles to column electrodes over the insulating layer and extend to parallel edges of the substrate for electrical connection. Another insulating layer is then deposited over the line patterned row electrodes, preserving the column vias and adding row vias. Row and column sub-pixels are now deposited connecting through row and columns vias to appropriate electrodes. A light emitting layer of known design is now added on top of the row and column electrode systems. An unpatterned transparent conductive coating is deposited over and limited to the light emitting layer area. A cover glass acting as hermetic seal is now added over the structure, but allowing for edge connection to the row and column electrodes.

Among the advantages of the invention may be one or more of the following. The electrode assembly of the invention reduces the number and size of electrodes required to achieve high pixel resolution, allows the application of high conductivity opaque metal electrodes, and enables the manufacture of large size displays with reduced power losses. The invention provides the ability to manufacture the entire electrode assembly independent from the electroluminescent portion of the device. This allows for testing of the electrode assembly prior to the deposition of the light emitting layer resulting in higher quality yields and increased production throughput for the electroluminescent display device than currently possible.

Other features and advantages of the invention will be apparent from the following description of the preferred embodiments, and the claims.

BRIEF DESCRIPTION OF THE DRAWING

FIGS. 5A, 5B, 5C, 5D, 5E, and 5F illustrate some but not all pixel configurations that can be incorporated in electroluminescent display devices, employing the invention.

DESCRIPTION OF THE PREFERRED EMBODIMENTS

Figure 1:
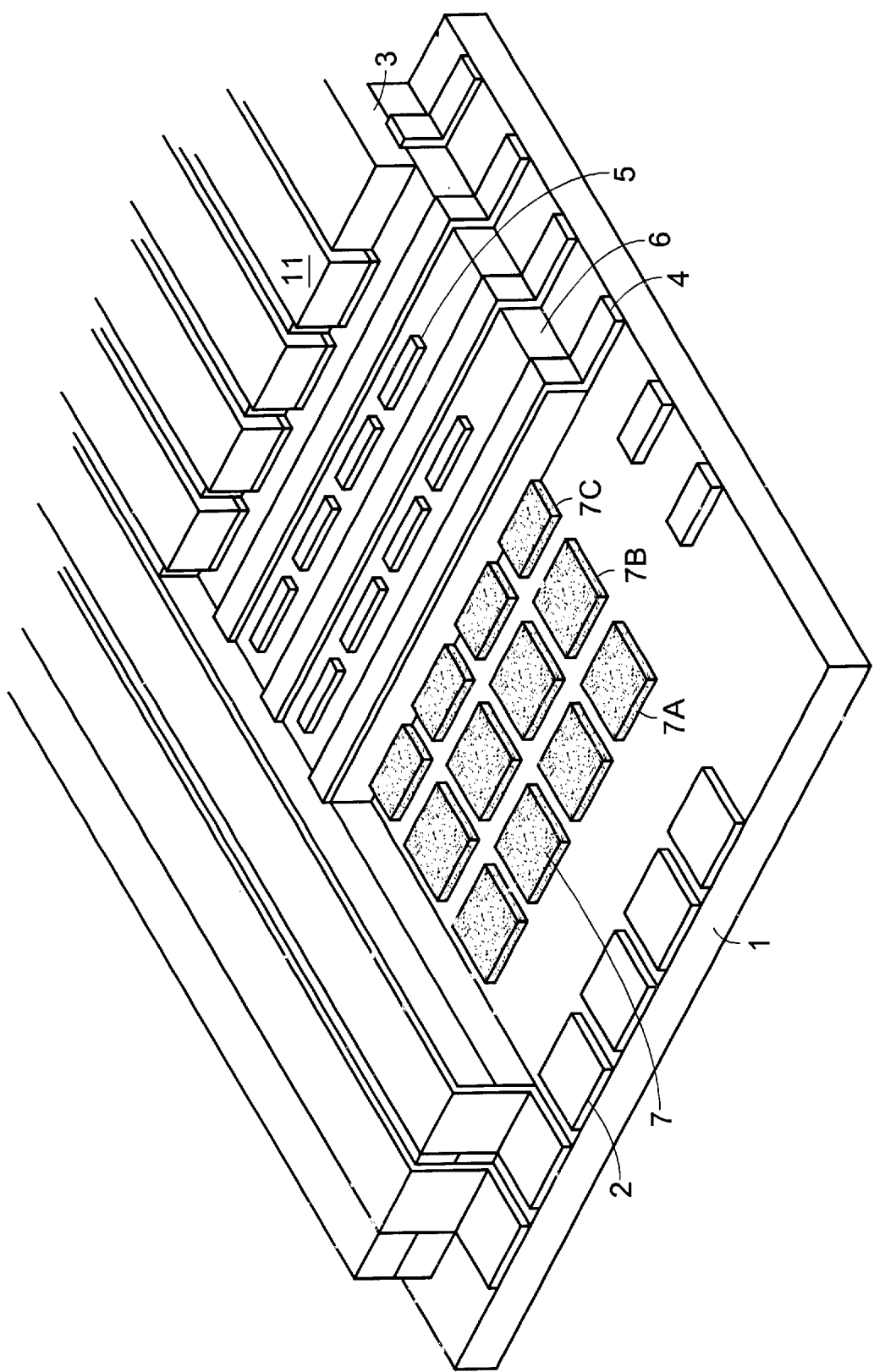
FIG. 1 is a fragmentary view of a first embodiment of the invention showing its application to an electroluminescent display device structure.

Referring now to FIG. 1, an electroluminescent display device 10 according to the invention, has a transparent substrate 1 on which is deposited a pixel defined layer of transparent conductive film 7 of a required resolution. Each film element 7a, 7b, 7c, . . . , represents one image pixel. A light-emitting layer 6 of a design well known to those in this field, is deposited over the transparent film element pixels 7. The light emitting layer 6 can have a plurality of sublayers. Row sub-pixels 5 and line patterned column metal electrodes 4 of appropriate size and resolution are now deposited simultaneously with the column electrodes extending to parallel edges of substrate 1 for electrical contact to exciting voltages. In one example the electrodes consist of aluminum. Other high conductivity metals such as chromium or opaque metal alloys or superconductors can also be used. An insulating layer 3 of appropriate breakdown strength for row to column isolation is then deposited with vias 11 positioned over the sub-pixels 5, penetrating into the insulating layer. In one example the insulating layer thickness is 2000 Å. Row electrodes 2 are deposited on insulating layer 3 so as to contact the row sub-pixels 5 through the vias 11 in insulating layer 3 with the line patterned row electrodes 2 also extending to parallel edges of substrate 1 and being oriented perpendicular to line patterned column electrodes 4. A cover glass (not shown) is now added, with a hermetic sealing material, extending over the active area of the structure, but allowing exposure of row and column electrode ends for electrical connection thereto.

Figure 2:
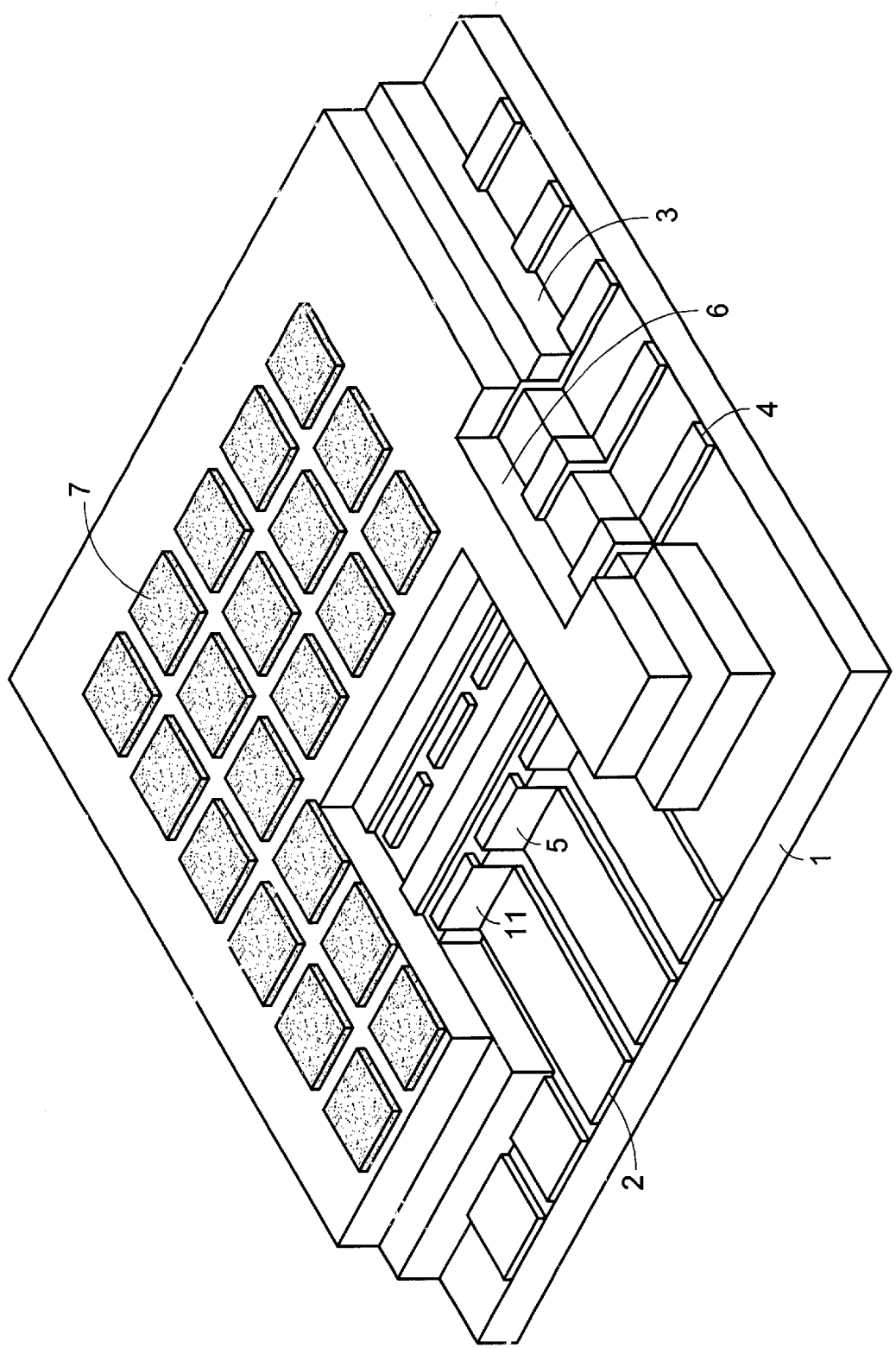
FIG. 2 is a fragmentary view of a second embodiment of the invention showing its application to an electroluminescent display device structure.

In the embodiments that follow, like reference numbers represent like elements. Referring now to FIG. 2, an electroluminescent display device structure, according to this invention, is shown, having a transparent, ceramic, semiconductor, or insulated metal substrate 1, upon which line patterned metal row electrodes 2 of required resolution are deposited. The line patterned row electrodes extend to parallel edges of substrate 1 for electrical contact to exciting voltages. An insulating layer 3 of appropriate breakdown strength for row to column isolation, is then deposited having conductive row vias 11 penetrating through the insulating layer 3. Metal row sub-pixels 5 and line patterned column electrodes 4 are deposited simultaneously on top of the insulating layer 3. The row sub-pixels 5 are aligned with the vias 11 to contact the line patterned row electrodes 2 and the line patterned column electrodes 4 extend to parallel edges of the substrate 1 and are oriented perpendicular to line patterned row electrodes 2. One or more light-emitting layers of known design 6 are then deposited. Transparent pixels 7 of required resolution are deposited over the light-emitting layer. A cover glass (not shown) is now added, with a hermetic sealing material, extending over the active area of the array display, but allowing exposure of row and column electrodes for electrical connection.

Figure 3:
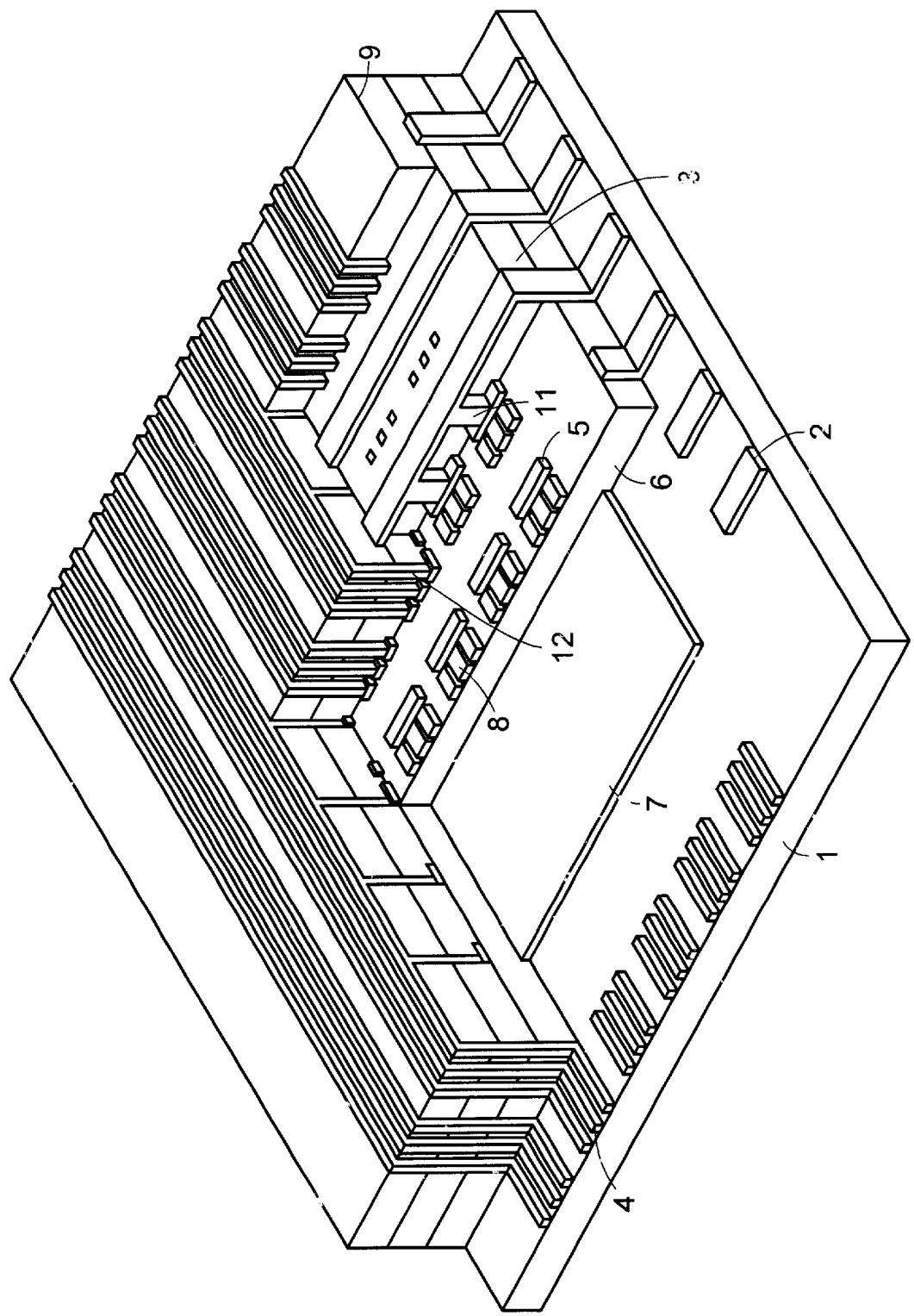
FIG. 3 is a fragmentary view of a third embodiment of the invention showing its application to a three phosphor color electroluminescent display device structure.

Referring now to FIG. 3, a three phosphor color electroluminescent display device structure, according to this embodiment of the invention, has a transparent substrate 1, upon which an unpatterned transparent conductive layer 7 is deposited. A light emitting layer 6 of known design is deposited over the transparent layer 7. The light emitting layer 6 can have a plurality of sublayers. Row and column sub-pixels 5 and 8, respectively, of appropriate resolution and shape are deposited on top of light emitting layer 6. An insulating layer 3 of appropriate breakdown strength for row to column isolation is then deposited having vias 11 and 12 positioned over row and column sub-pixels 5 and 8, respectively. Line patterned row electrodes 2 extending to parallel edges of the substrate 1 are then deposited on top of the insulating layer 3 so as to contact the row sub-pixels 5 through the vias 11. Another insulating layer 9 is deposited over the row electrodes 2 while preserving vias 12 for column sub-pixels 8. Line patterned column electrodes 4 are now deposited on top of the insulation layer 9 so as to contact the column sub-pixels 8 through the vias 12. The line patterned metal column electrodes 4 extend to parallel edges of substrate 1 and are aligned perpendicular to line patterned row electrodes 2. A cover glass (not shown) providing a hermetic seal extending over the active light emitting area and allowing exposure of row and column electrodes for electrical connection thereto, is added.

Figure 4:
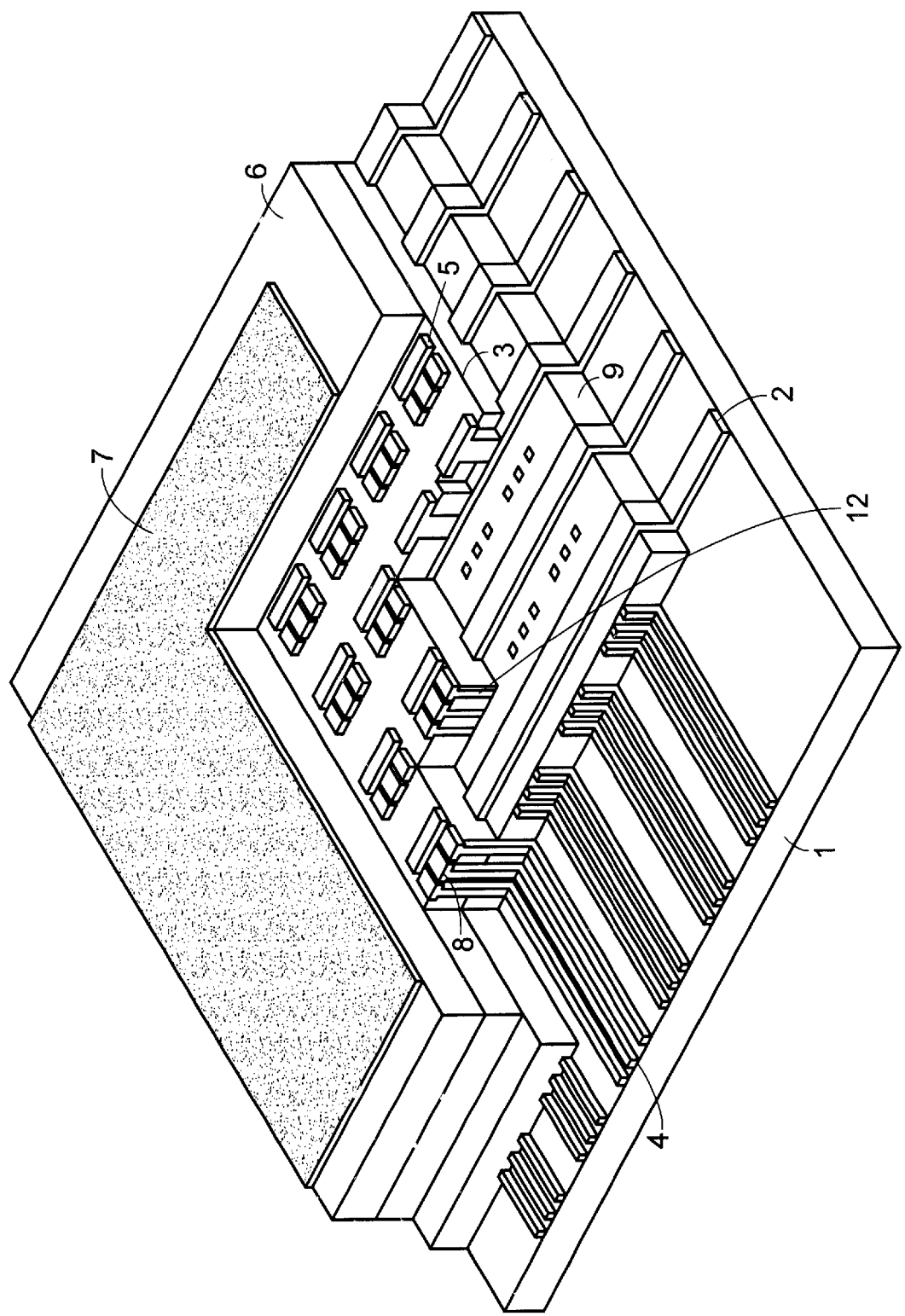
FIG. 4 is a fragmentary view of a fourth embodiment of the invention showing its application to a three phosphor color electroluminescent display device structure.

Referring now to FIG. 4, a three phosphor color electroluminescent display device structure, according to this embodiment of the invention, has a transparent, ceramic, semiconductor, or insulated metal, substrate 1, upon which line patterned column electrodes 4 of required resolution are deposited. The line patterned column electrodes 4 extend to parallel edges of substrate 1 for electrical contact to exciting voltages. An insulating layer 9 of appropriate breakdown strength for row and column isolation is then deposited with column vias 12 extending through the insulating layer 9. Line patterned row electrodes 2 are added on top of the insulating layer 9, and extend to parallel edges of the substrate 1 for electrical connection. Row electrodes 2 are perpendicular to column electrodes 4. Another insulating layer 3, through which row and column vias 11 and 12 pass, is deposited over row electrodes 2. Row and column sub-pixels 5 and 8 are now deposited on top of the insulating layer 3 and are positioned so as to contact the row 2 and column 4 line patterned electrodes through the appropriate vias 11 and 12, respectively. A light emitting layer 6 of known design is deposited over row 11 and column 12 vias. An unpatterned transparent conductive 7 layer is added over the light emitting layer 6. A cover glass (not shown) acting as a hermetic seal and extending over active light emitting layer, allowing exposure of row and column electrodes for electrical connection, is then laid down over the structure.

Referring now to FIGS. 5A, 5B, 5C, 5D, 5E, and 5F, the displayed pixel configurations 20a, 20b, 20c, 20d, 20e, and 20f, are used mainly with the structures of FIGS. 3 and 4, where multi-color displays are required. Column sub-pixels can be configured as parallel stripes 22 of individual color phosphors, or can be colored by utilizing color striped filters over white line phosphors. Color pixels can also be configured with each color pixel having a preferred size and shape 24, 26, and 28 to allow color compensation due to phosphor and filter efficiency. FIG. 5A would be a preferred structure for full color since the vertical color striped filters 22 can be used with black spacers to cover light with either of the interfacing column sub-pixels energized. Most other pixel designs require individual color pixel filter registration vertically and horizontally, while all designs with shared row sub-pixels require covering the row sub-pixels since it lights with all shared sub-pixels.

According to a method for manufacturing the first embodiment of the invention (FIG. 1), an electroluminescent display device is manufactured by depositing a pixel defined layer of required resolution as a conductive film 7 upon a transparent substrate 1, followed by the deposition of a light emitting layer 6 of known design over the conductive pixel layer 7, and of a plurality of line patterned column electrodes 4 of high conductivity metal simultaneously deposited over the light emitting layer 6 with a plurality of row sub-pixel electrodes 5. The line patterned column electrodes 4 extend to the edges of the substrate 1 for contacting the exciting voltages and the row sub-pixel electrodes 5 are aligned over the transparent conductive pixels 7a, 7b, 7c. An insulating layer 3 is then deposited over the line patterned column electrodes 4 and row sub-pixel electrodes 5 with conductive vias 11 penetrating through the insulating layer 3 thickness. The vias 11 are formed by photolithographic, laser ablation, or masking methods. An electrically conducting material, such as aluminum or chromium, is then deposited defining the line patterned row electrode 2. The line patterned row electrodes 2 extend to the edges of the substrate 1 for electrical contact and contact the row sub-pixel electrodes 5 through the conductive vias 11. A cover glass (not shown) providing a hermetic seal is now added over the active structure but allowing exposure of row 2 and column 4 electrodes ends for electrical connection.

According to a method for manufacturing the second embodiment of this invention (FIG. 2), an electrode structure is fabricated upon which the active electroluminescent matrix is deposited. This process allows for a prefabrication and testing of the electrode structure prior to the deposition of the active electroluminescent matrix. High conductivity line patterned row electrodes 2 are deposited on a substrate 1 of glass, ceramic or insulated metal extending to the edges of the substrate 1 for electrical contact. An insulating layer 3 with vias 11 penetrating through the insulating layer 3 is then deposited. Vias 11 are fabricated by photolithographic, laser ablation, or masking methods. A high conductivity metal is then deposited upon the insulating layer 3, defining line patterned column electrodes 4 and row sub-pixels 5. The line patterned column electrodes 4 extend to parallel edges of the substrate 1 for electrical contact, and the row sub-pixels 5 contact the line patterned row electrodes 2 through the vias 11. This electrode system can now be tested for conformance to specifications. A light-emitting layer 6 of known design is now added over this electrode system. Pixel patterned transparent electrodes 7 are now deposited over the light-emitting layer 6 registering with columns 4 and sub-pixels 5 below the light-emitting layer 6. A cover glass (not shown) providing a hermetic seal is now added over the active structure but allowing edge-contact with line patterned row electrodes 2 and line patterned column electrodes 4.

According to a manufacturing method of the third embodiment of this invention (FIG. 3), an unpatterned transparent conductive coating 7 is deposited on a transparent substrate 1. A light emitting layer 6 of known design is then deposited over the transparent conductive film 7. Column 4 and row sub-pixels 5 are then deposited over the light emitting layer 6 in a defined pixel configuration. An insulating layer 3 is then added over sub-pixels 5 with defined vias 11. The vias 11 are formed by photolithographic, laser ablation, or masking methods. Row electrodes 2 in a line configured design are now deposited extending to parallel edges of the substrate 1 for electrical connection. The line patterned row electrodes 2 connect to the row sub-pixels 5 through the vias 11 in the insulating layer 3. Another insulating layer 9 is then deposited over the row electrodes 2, while preserving column vias 12. Line patterned column electrodes 4 are deposited on top of the insulating layer 9. The lines of the column electrodes 4 run perpendicular to the lines of the row electrodes 2 and extend to parallel edges of the substrate 1 for electrical connection to the exciting voltages. The column electrodes 4 connect to the column sub-pixels 8, through the vias 12 in the insulating layers 3 and 9. A cover glass (not shown) providing a hermetic seal is then added over the active light emitting structure but allowing for edge connection to the row 2 and column 4 electrodes.

According to a method for manufacturing the fourth embodiment of this invention (FIG. 4), line patterned column 4 electrodes are deposited on a substrate 1 of glass, ceramic or insulated metal extending to parallel edges of the substrate 1 for electrical connection. An insulating layer 9, is then added over the column electrodes 4, featuring column vias 12. The vias 12 are formed by photolithographic, laser ablation, or masking methods. Line patterned row electrodes 2 are then deposited at right angles to column electrodes 4 over the insulating layer 9 and extend to parallel edges of the substrate 1 for electrical connection. Another insulating layer 3 is then deposited over the line patterned row electrodes 2, while preserving column vias 12 and adding row vias 11. Row 5 and column 8 sub-pixels are now deposited connecting through row 11 and column vias 12, respectively, to appropriate electrodes. A light emitting layer 6 of known design is added on top of the row 2 and column 4 electrode systems. An unpatterned transparent conductive coating 7 is deposited over and limited to the light emitting layer 6 area. A cover glass (not shown), providing a hermetic seal is now added over the structure but allows for edge connection to the row 2 and column 4 electrodes. In the illustrated embodiments of FIGS. 1, 2, 3, and 4, the different layers that are shown may be deposited by known techniques such as chemical vapor deposition, thermal evaporation, electron beam evaporation, or sputtering. Because the deposition processes are basically known, they are not discussed in any further detail herein. Also because the formation of the basic thin films such as those forming the phosphor are also well known, the process involving the deposition of these films is not described in any further detail herein.

Additions, subtractions and other modifications of the disclosed embodiments of the invention will be apparent to those practiced in this field and are within the following claims.

What is claim is:

1. An electroluminescent display device comprising
   a light emitting layer having a first and a second surface on opposite sides of the layer,
   an electrode assembly in contact with and on one side of the first surface of said light emitting layer,
   a transparent conductive layer in contact with said second surface and on a side of said light emitting layer opposite from the electrode assembly,
   said electrode assembly comprising
      a plurality of first line patterned electrodes,
      a plurality of second line patterned electrodes, a plurality of first sub-pixel electrodes adjacent to the second line patterned electrodes,
      a first insulating layer, separating the first and second line patterned electrodes,
      a plurality of first vias, each via extending from at least one of said first sub-pixel electrodes through the said insulating layer, to one of said first line patterned electrodes,
      a plurality of second sub-pixel electrodes adjacent to the first sub-pixel electrodes,
      a second insulating layer separating the first and second sub-pixel electrodes from the second line patterned electrodes, and
      a plurality of second vias, each via extending from at least one of said second sub-pixel electrodes through the said insulating layers, to one of said second line patterned electrodes.

2. A electroluminescent display device comprising
   an electrode assembly comprising
      a substrate,
      a plurality of first opaque line patterned electrodes in contact with said substrate,
      a plurality of second opaque line patterned electrodes,
      an insulating layer separating first and second line patterned electrodes,
      a plurality of first sub-pixel electrodes adjacent to said second line patterned electrodes,
      a plurality of first vias, each via extending from at least one of said first sub-pixel electrodes through the said insulating layer to a first line electrode,
   a light emitting layer having a first and second surface on opposite sides of the light emitting layer and said first surface is in contact with said first sub-pixel and second line patterned electrodes, and
   a plurality of transparent conductive film pixels, in contact with said second surface of said light emitting layer opposite the first sub-pixel electrodes and second line patterned electrodes.

3. The electroluminescent display device of claim 2 wherein the electrode assembly further comprises
   a pluraluty of second sub-pixel electrodes adjacent to first sub-pixel electrodes and in contact with said first surface of the light emitting layer, and
   a second insulating layer separating said first and second sub-pixel and second line patterned electrodes and having second vias connecting said second sub-pixel electrodes to said second line patterned electrodes through said first and second insulating layers.

4. An electroluminescent display device comprising
   a pluratily of first line patterned electrodes,
   a plurality of second line patterned electrodes,
   a first insulating layer separating said first and second line patterned electrodes,
   a plurality of first sub-pixel electrodes adjacent to said second line patterned electrodes,
   a light emitting layer having a first and second surface on opposite sides of the light emitting layer wherein said first surface is in contact with said first sub-pixel electrodes and second line patterned electrodes,
   a plurality of first vias, each via extending from at least one of said first sub-pixel electrodes through the said insulating layer, to one of said first line patterned electrodes,
   a transparent conductive film layer comprising a plurality of conductive pixels, in contact with said second surface of said light emitting layer and on a side of said light emitting layer opposite from the sub-pixel electrodes,
   a transparent substrate in contact with the said transparent conductive film layer on a side opposite the light emitting layer,
   a plurality of second sub-pixel electrodes adjacent to said first sub-pixel electrodes and in contact with said first surface of the light emitting layer, and a second insulating layer separating said first and second sub-pixel electrodes and second line patterned electrodes and having second vias connecting said second line patterned electrodes to said second sub-pixel electrodes through said first and second insulating layers.

5. The electroluminscent display device of claim 4 wherein the substrate comprises opaque materials selected from the group of silicon, ceramics, insulated metal and coated glass.

6. A method of manufacturing an electroluminescent device comprising the steps of depositing a transparent conductive film layer on a transparent substrate, depositing a light emitting layer on said transparent conductive film layer, depositing a plurality of first and second sub-pixel electrodes on said light emitting layer, depositing a first insulating layer on said light emitting layer, forming vias in said insulating layer registering over said first sub-pixel electrodes, depositing a plurality of second line patterned electrodes on said first insulating layer, depositing a second insulating layer on said second line patterned electrodes, depositing a plurality of first line patterned electrodes on said second insulating layer connecting to said first and second sub-pixel electrodes through said vias, and covering and sealing the device with a glass cover.

7. A method of manufacturing an electroluminescent device comprising the steps of manufacturing an electrode assembly, testing the electrode assembly, depositing a light emitting layer onto said electrode assembly, depositing a transparent conductive layer onto said light emitting layer, the step of manufacturing comprises depositing a plurality of first line patterned conductive metal electodes on a substrate, depositing a first insulating layer on top of said first line patterned electrodes, forming first vias in said insulating layer in contact with said first line patterned electrodes, deposting a plurality of second line patterned electrodes on top of said first insulating layer, depositing a second insulating layer on top of said second line patterned electrodes, while preserving the first vias, forming second vias in said second insulating layer in contact with said second electrodes, and depositing a plurality of first and second sub-pixel electrodes on top of said second insulating layer, contacting said first and second line patterned electrodes through said first and second vias, respectively.

* * * * *